US011525875B2

United States Patent
Lassalle-Balier et al.

(10) Patent No.: US 11,525,875 B2
(45) Date of Patent: Dec. 13, 2022

(54) REDUCING VOLTAGE NON-LINEARITY IN A BRIDGE HAVING TUNNELING MAGNETORESISTANCE (TMR) ELEMENTS

(71) Applicant: Allegro MicroSystems, LLC, Manchester, NH (US)

(72) Inventors: Rémy Lassalle-Balier, Bures sur Yvette (FR); Pierre Belliot, Bourg-la-reine (FR); Christophe Hoareau, Jouy-en-Josas (FR); Jean-Michel Daga, Bourg-la-Reine (FR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/502,391

(22) Filed: Oct. 15, 2021

(65) Prior Publication Data

US 2022/0043082 A1 Feb. 10, 2022

Related U.S. Application Data

(62) Division of application No. 16/553,633, filed on Aug. 28, 2019, now Pat. No. 11,175,359.

(51) Int. Cl.
*G01R 33/02* (2006.01)
*G01R 33/09* (2006.01)
(Continued)

(52) U.S. Cl.
CPC ............ *G01R 33/098* (2013.01); *G01B 7/30* (2013.01); *G01R 33/0082* (2013.01); *G01R 33/093* (2013.01)

(58) Field of Classification Search
CPC ............ G01R 33/0023; G01R 33/0082; G01R 33/093; G01R 33/0094; G01R 33/098;
(Continued)

(56) References Cited

U.S. PATENT DOCUMENTS 7,551,028 B1 * 6/2009 Cyrusian ................. H03F 3/217
330/10
7,936,144 B2  5/2011 Vig et al.
(Continued)

FOREIGN PATENT DOCUMENTS

DE   10 2016 104285 A1   9/2016
DE   10 2015 218 855 A1   3/2017
(Continued)

OTHER PUBLICATIONS

Response to Exam Report filed on Dec. 2, 2021 for European Application No. 18842507.8; 30 pages.
(Continued)

*Primary Examiner* — Thang X Le
(74) *Attorney, Agent, or Firm* — Daly, Crowley, Mofford & Durkee, LLP

(57) ABSTRACT

In one aspect, a magnetic field sensor includes a plurality of tunneling magnetoresistance (TMR) elements that includes a first TMR element, a second TMR element, a third TMR element and a fourth TMR element. The first and second TMR elements are connected to a voltage source and the third and fourth TMR elements are connected to ground. Each TMR element has a pillar count of more than one pillar and the pillar count is selected to reduce the angle error below 1.0°.

22 Claims, 12 Drawing Sheets

(51) Int. Cl.
*G01R 33/00* (2006.01)
*G01B 7/30* (2006.01)

(58) Field of Classification Search
CPC .. G01R 33/025; G01R 33/07; G01R 33/0206; G01R 33/06; G01R 33/063; G01R 33/09; G01R 33/0052; G01R 33/18; G01D 5/145; G01D 5/147; G01D 5/12; G01D 5/14; G01D 5/16; G01D 5/165; G01D 5/2457; G01D 5/2013; G01D 5/2046; G01D 5/24476; G01D 5/245; G01N 27/9033; G01N 27/902; G01N 27/9013; G01N 27/904; G01N 27/223; G01N 27/82; G01N 27/9093
See application file for complete search history.

(56) References Cited

U.S. PATENT DOCUMENTS

| | | | |
|---|---|---|---|
| 8,084,969 B2 | 12/2011 | David et al. | |
| 8,138,708 B2 | 3/2012 | Ward et al. | |
| 8,461,782 B2 | 6/2013 | Ward et al. | |
| 8,629,642 B2 | 1/2014 | Ward et al. | |
| 8,716,959 B2 | 5/2014 | David et al. | |
| 8,736,316 B2 | 5/2014 | Chaware et al. | |
| 8,873,944 B2 | 10/2014 | Latham et al. | |
| 9,042,716 B2 | 5/2015 | Cadugan et al. | |
| 9,322,887 B1 | 4/2016 | Eagen et al. | |
| 9,354,284 B2 | 5/2016 | Latham | |
| 9,470,765 B1 | 10/2016 | Latham | |
| 9,529,060 B2 | 12/2016 | Fermon et al. | |
| 9,605,975 B2 | 3/2017 | Foletto et al. | |
| 9,605,979 B2 | 3/2017 | Eagen et al. | |
| 9,625,535 B2 | 4/2017 | Cadugan et al. | |
| 9,719,806 B2 | 8/2017 | Foletto et al. | |
| 9,720,054 B2 | 8/2017 | Drouin et al. | |
| 9,784,594 B2 | 10/2017 | David et al. | |
| 9,804,234 B2 | 10/2017 | Dressier et al. | |
| 9,812,637 B2 | 11/2017 | Fermon et al. | |
| 9,823,090 B2 | 11/2017 | Foletto et al. | |
| 9,823,092 B2 | 11/2017 | David et al. | |
| 9,880,026 B1 | 1/2018 | Eagen et al. | |
| 9,910,087 B2 | 3/2018 | Eagen et al. | |
| 10,036,785 B2 | 7/2018 | David et al. | |
| 10,041,810 B2 | 8/2018 | Vig et al. | |
| 10,290,608 B2 | 5/2019 | Latham et al. | |
| 10,309,803 B2* | 6/2019 | Cosgrave | G01D 5/24461 |
| 10,310,028 B2 | 6/2019 | Latham et al. | |
| 10,347,277 B2 | 7/2019 | Campiglio et al. | |
| 10,386,169 B2* | 8/2019 | Hirota | G01R 33/093 |
| 10,509,058 B2 | 12/2019 | Cadugan et al. | |
| 10,557,725 B2 | 2/2020 | Paul et al. | |
| 10,585,152 B2 | 3/2020 | David et al. | |
| 11,175,359 B2 | 11/2021 | Lassalle-Balier et al. | |
| 2002/0191451 A1 | 12/2002 | Kishi et al. | |
| 2005/0128654 A1 | 6/2005 | Sapozhnikov | |
| 2006/0267581 A1 | 11/2006 | Wiese | |
| 2007/0228500 A1* | 10/2007 | Shimazu | G01B 7/18 257/417 |
| 2009/0189601 A1 | 7/2009 | Okada et al. | |
| 2010/0073827 A1 | 3/2010 | Zhao et al. | |
| 2010/0271013 A1 | 10/2010 | Servel et al. | |
| 2010/0301845 A1 | 12/2010 | Acker | |
| 2011/0037459 A1 | 2/2011 | Okada et al. | |
| 2011/0285395 A1 | 11/2011 | van Veldhoven et al. | |
| 2012/0038348 A1 | 2/2012 | Aimuta et al. | |
| 2012/0095712 A1 | 4/2012 | Komasaki et al. | |
| 2012/0119729 A1 | 5/2012 | Komasaki et al. | |
| 2013/0113478 A1 | 5/2013 | Pant | |
| 2013/0335070 A1 | 12/2013 | Abe et al. | |
| 2014/0028307 A1 | 1/2014 | Ausserlechner | |
| 2014/0225605 A1 | 8/2014 | Lei et al. | |
| 2014/0225649 A1* | 8/2014 | Yoshikawa | H03K 5/2481 327/53 |
| 2015/0192432 A1 | 7/2015 | Noguchi et al. | |
| 2016/0169707 A1 | 6/2016 | Hirota et al. | |
| 2016/0313412 A1 | 10/2016 | Li et al. | |
| 2017/0322052 A1 | 11/2017 | Paul et al. | |
| 2018/0113179 A1 | 4/2018 | Deak et al. | |
| 2018/0224300 A1 | 8/2018 | Vig et al. | |
| 2018/0335484 A1 | 11/2018 | Campiglio et al. | |
| 2018/0335486 A1 | 11/2018 | Lassalle-Balier et al. | |
| 2019/0219643 A1 | 7/2019 | Cadugan et al. | |
| 2019/0234764 A1 | 8/2019 | Lassalle-Balier | |
| 2019/0383646 A1 | 12/2019 | Lassalle-Balier et al. | |
| 2020/0018780 A1 | 1/2020 | Cadugan et al. | |
| 2020/0033424 A1 | 1/2020 | Campiglio et al. | |
| 2020/0041310 A1 | 2/2020 | Lassalle-Balier et al. | |
| 2020/0041583 A1 | 2/2020 | Cadugan et al. | |
| 2020/0041584 A1 | 2/2020 | Lassalle-Balier et al. | |
| 2020/0064413 A1 | 2/2020 | Campiglio et al. | |
| 2020/0066790 A1 | 2/2020 | Lassalle-Balier et al. | |
| 2020/0166381 A1* | 5/2020 | Mochizuki | G01D 5/24476 |
| 2020/0379064 A1 | 12/2020 | Yuan | |
| 2021/0063501 A1 | 3/2021 | Lassalle-Balier et al. | |
| 2022/0043082 A1 | 2/2022 | Lassalle-Balier et al. | |

FOREIGN PATENT DOCUMENTS

| | | |
|---|---|---|
| DE | 10 2018 113821 A1 | 12/2018 |
| EP | 2 674 728 A2 | 12/2013 |
| JP | 2011-158488 | 8/2011 |
| JP | 2014-071039 A | 4/2014 |
| WO | WO 2019/152112 A1 | 8/2019 |
| WO | WO 2021/040797 A1 | 3/2021 |

OTHER PUBLICATIONS

U.S. Notice of Allowance dated Nov. 1, 2021 for U.S. Appl. No. 16/553,641; 12 Pages.
U.S. Notice of Allowance dated Jun. 16, 2022 for U.S. Appl. No. 16/921,191; 27 pages.
U.S. Appl. No. 16/921,191, filed Jul. 6, 2020, Lassalle-Balier.
U.S. Appl. No. 16/822,488, filed Mar. 18, 2020, Lassalle-Balier et al.
U.S. Appl. No. 16/800,229, filed Feb. 25, 2020, Lassalle-Balier et al.
U.S. Appl. No. 16/749,074, filed Jan. 22, 2020, Romero.
U.S. Appl. No. 16/553,641, filed Aug. 28, 2019, Lassalle-Balier et al.
U.S. Appl. No. 16/522,810, filed Jul. 26, 2019, David et al.
U.S. Appl. No. 16/507,560, filed Jul. 10, 2019, Lassalle-Balier et al.
U.S. Appl. No. 16/507,544, filed Jul. 10, 2019, David et al.
U.S. Appl. No. 16/420,470, filed May 23, 2019, Tran et al.
U.S. Appl. No. 16/398,522, filed Apr. 30, 2019, Cesaretti et al.
U.S. Appl. No. 16/244,452, filed Jan. 10, 2019, Lassalle-Balier et al.
U.S. Appl. No. 16/232,348, filed Dec. 26, 2018, Eagen et al.
U.S. Appl. No. 16/157,317, filed Oct. 11, 2018, Lassalle-Balier et al.
U.S. Appl. No. 16/157,313, filed Oct. 11, 2018, Lassalle-Balier et al.
U.S. Appl. No. 16/145,841, filed Sep. 28, 2018, Foletto et al.
U.S. Appl. No. 16/139,742, filed Sep. 24, 2018, Romero.
PCT International Search Report and Written Opinion dated Sep. 6, 2021 for International Application No. PCT/US2021/034432; 15 Pages.
PCT International Search Report and Written Opinion dated Mar. 14, 2019 for International Application No. PCT/US2018/066995; 13 Pages.
PCT International Search Report and Written Opinion dated Oct. 23, 2020 for International Application No. PCT/US2020/046883; 15 Pages.
U.S. Non-Final Office Action dated May 17, 2019 for U.S. Appl. No. 15/884,619; 29 Pages.
Response to U.S. Non-Final Office Action dated May 17, 2019 for U.S. Appl. No. 15/884,619; Response filed Jun. 24, 2019; 10 Pages.
U.S. Notice of Allowance dated Feb. 15, 2019 for U.S. Appl. No. 15/884,619; 12 Pages.
$2^{nd}$ Notice of Allowance dated Sep. 4, 2019 for U.S. Appl. No. 15/884,619; 16 Pages.

(56) References Cited

OTHER PUBLICATIONS

U.S. Preliminary Amendment filed Jul. 6, 2020 for U.S. Appl. No. 16/822,488; 16 Pages.
U.S. Non-Final Office Action dated Apr. 22, 2021 for U.S. Appl. No. 16/553,641; 15 Pages (Atty. Dckt. No. ALLEG-653AUS).
Response to U.S. Non-Final Office Action dated Apr. 22, 2021 for U.S. Appl. No. 16/553,641; Response filed Jul. 19, 2021; 15 Pages.
U.S. Final Office Action dated Sep. 16, 2021 for U.S. Appl. No. 16/553,641; 11 Pages.
Jaffrés et al., "Angular Dependence of the Tunnel Magnetoresistance in Transition-Metal-Based Junctions;" Physical Review B, vol. 64, 064427; Jul. 2001; 7 Pages.
U.S. Restriction Requirement dated May 28, 2021 for U.S. Appl. No. 16/553,633; 7 Pages.
Response to U.S. Restriction Requirement dated May 28, 2021 for U.S. Appl. No. 16/553,633; Response filed Jul. 28, 2021; 1 Page.
U.S. Notice of Allowance dated Sep. 13, 2021 for U.S. Appl. No. 16/553,633; 13 Pages.
European Communication Pursuant to Rules 161/162 dated Mar. 16, 2022 for European Application No. 20768142.0; 3 Pages.
Response to Extended European Search Report (EESR) dated Jul. 29, 2021 for European Application No. 21156380.4; Response filed on Mar. 22, 2022; 17 Pages.
Response (with Machine English translation from Espacenet.com) to Japanese Office Action dated Jan. 4, 2022 for Japanese Application No. 2020-541381; Response filed Apr. 4, 2022; 23 pages.
Japanese Office Action with English translation dated Jan. 4, 2022 for Japanese Application No. 2020-541381; 6 pages.
U.S. Non-Final Office Action dated May 12, 2022 for U.S. Appl. No. 16/822,488; 11 Pages.
Response to U.S. Non-Final Office Action dated May 12, 2022 for U.S. Appl. No. 16/822,488; Response filed May 20, 2022; 12 Pages.
Intention of Grant dated Jun. 28, 2022 for European Application No. 18842507.8; 6 pages.
European Examination Report dated Aug. 2, 2021 for European Application No. 18842507.8; 5 pages.
PCT International Preliminary Report dated Mar. 10, 2022 for International Application No. PCT/US2020/046883; 9 Pages.
Response to U.S. Final Office Action dated Sep. 16, 2021 for U.S. Appl. No. 16/553,641; Response filed Oct. 12, 2021; 14 Pages.
Extended European Search Report dated Jul. 29, 2021 for European Application No. 21156380.4; 9 Pages.
Japanese Office Action with English translation dated Sep. 2, 2022 for Japanese Application No. 2020-541381; 9 pages.
U.S. Notice of Allowance dated Aug. 24, 2022 for U.S. Appl. No. 16/822,488; 10 Pages.
Response to European Office Action dated Mar. 16, 2022 for European Application No. EP20768142.0; Response filed Sep. 26, 2022; 13 pages.

* cited by examiner

REDUCING VOLTAGE NON-LINEARITY IN A BRIDGE HAVING TUNNELING MAGNETORESISTANCE (TMR) ELEMENTS

CROSS REFERENCE TO RELATED APPLICATIONS

This application is a divisional of U.S. patent application Ser. No. 16/553,633, filed Aug. 28, 2019, entitled "REDUCING VOLTAGE NON-LINEARITY IN A BRIDGE HAVING TUNNELING MAGNETORESISTANCE (TMR) ELEMENTS." The application cited in this paragraph is incorporated herein by reference in its entirety.

BACKGROUND

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e. in direct proportion) to the magnetic field.

Some magnetic field sensors include magnetoresistance (MR) elements, such as giant magnetoresistance (GMR) elements and tunneling magnetoresistance (TMR) elements. Generally, GMR and TMR elements have a relatively high sensitivity compared, for example, to Hall effect elements. GMR and TMR elements have moderately good linearity, but over a restricted range of magnetic fields. However, even in the restricted range of magnetic fields, the linearity of the GMR or TMR element can suffer from irregularities, such as due to high temperatures.

Further, angle sensors using GMR and TMR elements can experience angle error due to phenomena such as spin flop (i.e. alteration of reference direction at high magnetic fields or anisotropy field (e.g., magnetocrystalline anisotropy or shape anisotropy)). For example, the angle obtained with GMR elements can experience error up to several degrees.

SUMMARY

In one aspect, a magnetic field sensor includes a plurality of tunneling magnetoresistance (TMR) elements that includes a first TMR element, a second TMR element, a third TMR element and a fourth TMR element. The first and second TMR elements are connected to a voltage source and the third and fourth TMR elements are connected to ground. Each TMR element has a pillar count of more than one pillar and the pillar count is selected to reduce the angle error below 1.0°.

In another aspect, a magnetic field sensor includes a plurality of tunneling magnetoresistance (TMR) elements that include a first TMR element, a second TMR element, a third TMR element and a fourth TMR element arranged in a bridge. A voltage across each TMR element is constant. The first and second TMR elements are connected to a voltage source. The magnetic field sensor also includes a plurality of transistors that include a first transistor, a second transistor, a third transistor and a fourth transistor and each transistor is connected to another transistor and to a TMR element. The magnetic field sensor also includes a first amplifier and a second amplifier. An output of the first amplifier is connected to a base of the first transistor and the output of the first amplifier is connected to a base of the second transistor. A first input of the first amplifier is connected to the first TMR element and the second input of the first amplifier is connected to the second TMR element. An output of the second amplifier is connected to a base of a third transistor and the output of the second amplifier is connected to a base of a fourth transistor. A first input of the second amplifier is connected to the third TMR element and the second input of the second amplifier is connected to the fourth TMR element.

In a further aspect, a magnetic field sensor includes a plurality of tunneling magnetoresistance (TMR) elements that include a first TMR element, a second TMR element, a third TMR element and a fourth TMR element arranged in a bridge. A voltage across each TMR element is constant. The first and second TMR elements are connected to a constant voltage source and the third and fourth TMR elements are connected to ground. The first and third TMR elements are connected to a first bridge node and the second and third TMR elements are connected to a second bridge node. The magnetic field sensor also includes a first resistor connected to the first bridge node and a first output node, a second resistor connected to the second bridge node and a second output node, a first amplifier and a second amplifier. An output of the first amplifier is connected to the first output node and the first resistor and a first input of the first amplifier is connected to the first bridge node and the first resistor. An output of the second amplifier is connected to the second output node and the second resistor. A first input of the second amplifier is connected to the second bridge node and the second resistor and a second input of the second amplifier is connected to a second input of the first amplifier.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to reduce voltage non-linearity in a bridge having one or more tunneling magnetoresistance (TMR) elements.

Figure 1:
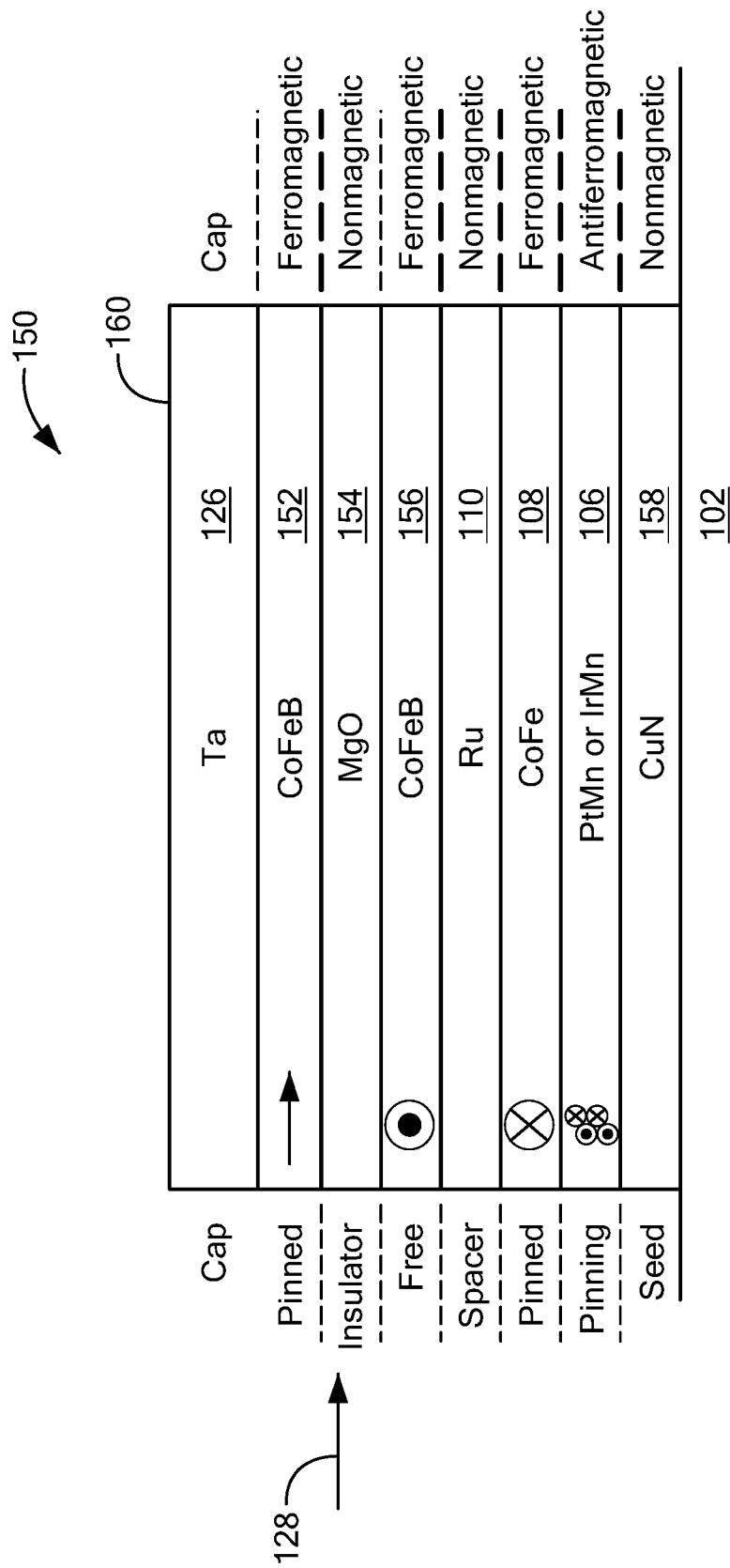
FIG. 1 is a block diagram showing an illustrative tunneling magnetoresistance (TMR) element having layers.

Referring to FIG. 1, an illustrative TMR element can have a stack 150 of layers 158, 106-110, 156, 154, 152, 126 disposed upon a surface of a substrate 102. FIG. 1 is indicative of one pillar 160 of a multi-pillar TMR element. For example, a TMR element may be comprised of two or more pillars 160 that are identical and formed from stack 150.

It will be understood that a driving current running through the TMR element 150 runs through all of the layers of the stack, running between seed and cap layers 158 and 126 (i.e. perpendicular to a surface of the substrate 102) and the TMR element 150 is sometimes referred to as a current perpendicular-to-plane (CPP) magnetoresistance element. The TMR element 150 can have a maximum response axis that is parallel to the surface of the substrate and that is in the direction 128 perpendicular to zero field magnetic directions of the free layer 156, and also parallel to the bias field generated by the reference layers, most notably in the pinned layer 152.

The TMR element 150 is pinned (i.e. it has a pinning layer 106). A synthetic antiferromagnet (SAF) is formed from layers 108, 110 and 156. The aim of the SAF is to pin layer 156. The layer 156 is referred to as a reference layer. The single layer pinned layer 108 is magnetically connected to the pinning layer 106. The layers 106, 108 are collectively referred to as bias layers. With zero external magnetic field, the reference layer 156 takes on a magnetic alignment parallel to the bias layers 106, 108, with direction (ferromagnetic or antiferromagnetic coupling) determined by thickness and material of the spacer layer 110. In some embodiments, the single layer pinned layer 108 is replaced by another SAF structure.

As described above, in general, the TMR element 150 has a maximum response axis (maximum response to external fields) aligned with the arrow 128 (i.e. perpendicular to bias directions experienced by the free layer 156, and parallel to magnetic fields of the reference layers, notably pinned layers 152). Also, in general, it is rotations of the magnetic direction of the free layer 156 caused by external magnetic fields that result in changes of resistance of the TMR element 150.

Figure 2A:
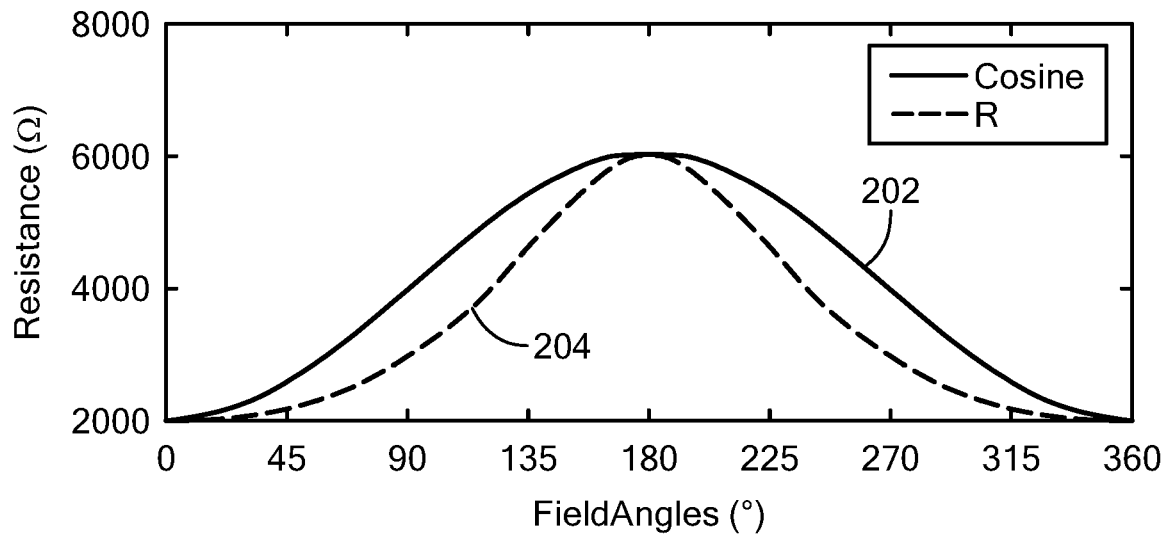
FIG. 2A is a graph of resistance versus field angle for a TMR element.

Referring to FIG. 2A, a resistance of a tunneling magnetoresistance (TMR) element is not linearly dependent to a cosine of an angle between a free layer and a reference layer of the TMR element. For example, a cosine curve 202 represents a cosine of an angle between a free layer (e.g., free layer 156 (FIG. 1)) and a reference layer (e.g., the reference layer 152 (FIG. 1)) of the TMR element and a resistance curve 204 represents a resistance of the TMR.

Figure 2B:
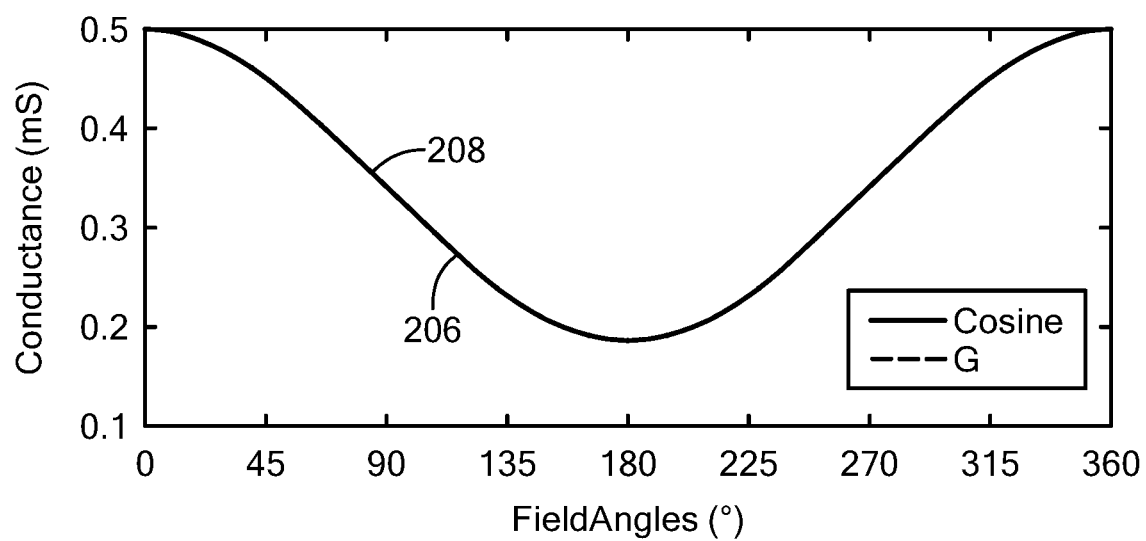
FIG. 2B is a graph of conductance versus field angle for a TMR element.

Referring to FIG. 2B, unlike resistance, a conductance of a TMR element is linearly dependent to a cosine of an angle between a free layer and a reference layer of the TMR element. For example, a conductance curve 206 represents a conductance of the TMR element and is similar to a cosine curve 208 representing the cosine of an angle between a free layer (e.g., free layer 156 (FIG. 1)) and a reference layer (e.g., the reference layer 152 (FIG. 1)) of the TMR element.

Figure 3:
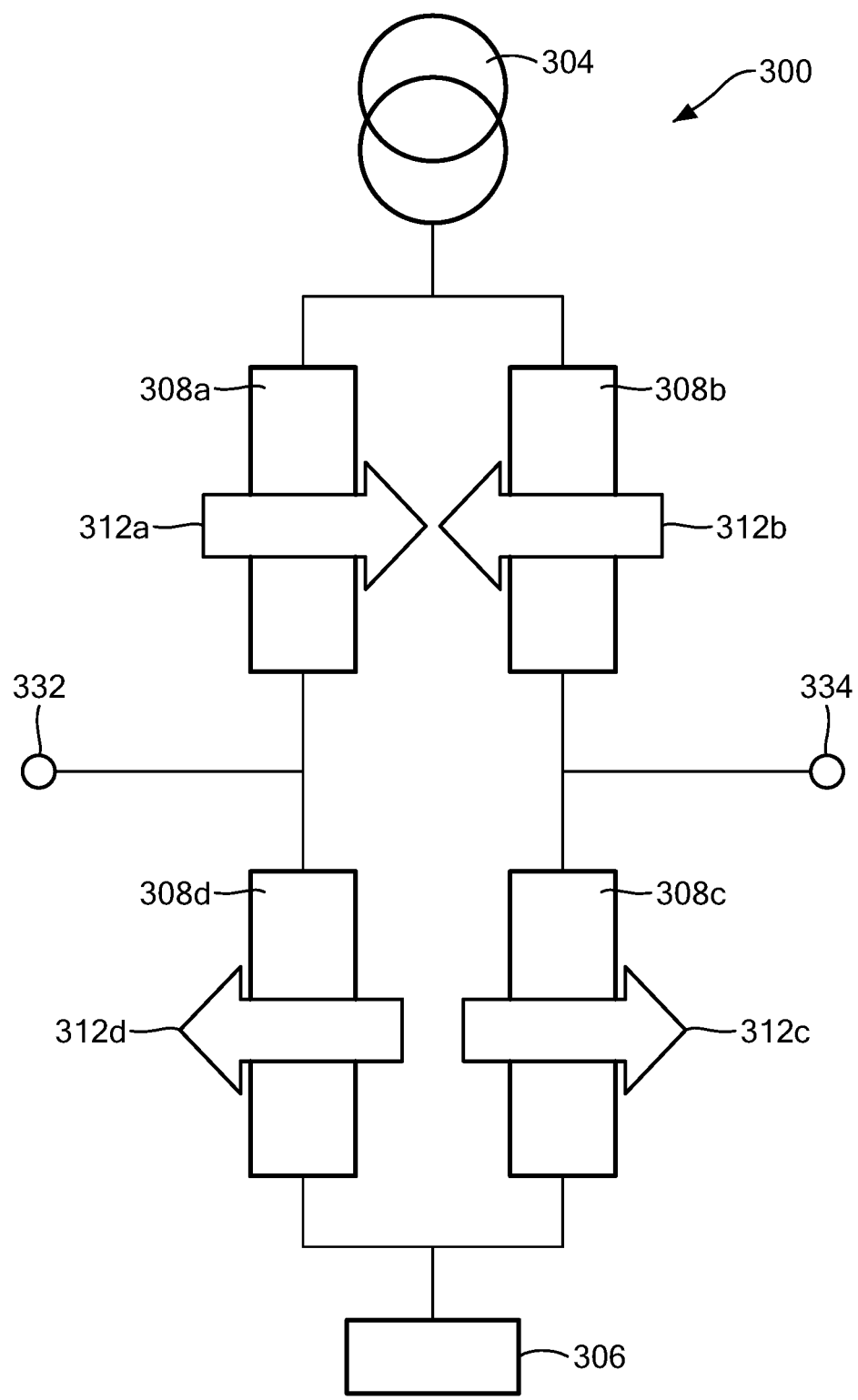
FIG. 3 is a circuit diagram of an example of a current-driven bridge having TMR elements.

Referring to FIG. 3, an example of a current-driven magnetometer bridge with TMR elements is a current-driven bridge 300. The current-driven bridge 300 includes TMR elements (e.g., a TMR element 308a, a TMR element 308b, a TMR element 308c and a TMR element 308d).

Each TMR element has a reference direction (e.g., similar to direction 128 (FIG. 1). For example, the TMR element 308a has a reference direction 312a, the TMR element 308b has a reference direction 312b, the TMR element 308c has a reference direction 312c and the TMR element 308d has a reference direction 312d. The reference direction 312a is substantially in the same direction as reference direction 312c but opposite (i.e. by 180°) from reference direction 312b and reference direction 312d.

The TMR element 308a and TMR element 308b are connected to a current source 304. In one example, the current source 304 supplies 0.5 mA. The TMR elements 312c and TMR element 312d are connected to ground 306.

The current-driven bridge 300 includes a node 332 between the TMR elements 308a, 308d and a node 334 between the TMR elements 308b, 308c. The output of the current-driven bridge 300 is the differential voltage across the nodes 332, 334.

Figure 4:
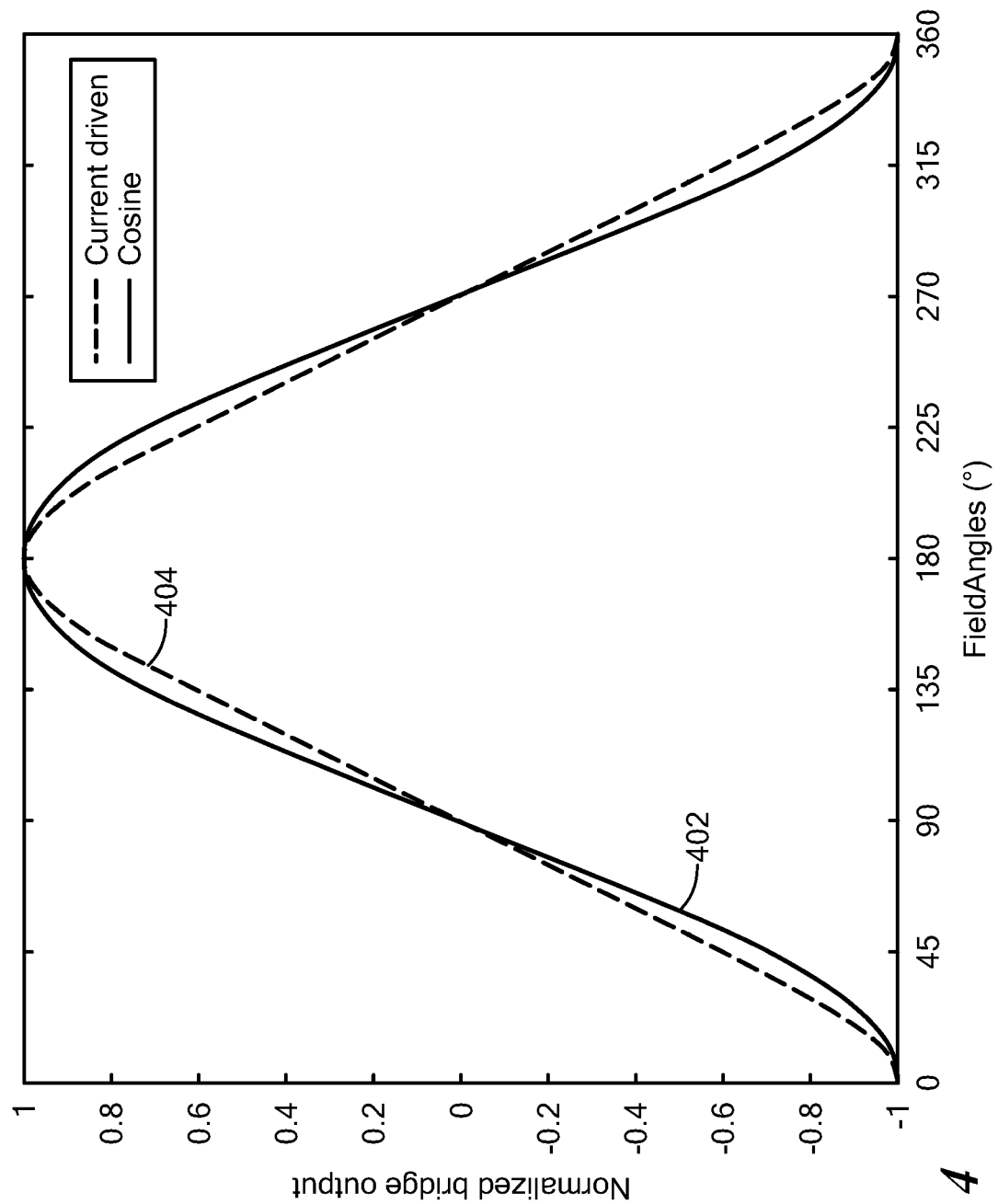
FIG. 4 is a graph of normalized bridge output versus field angle for the current-driven bridge of FIG. 3.

Referring to FIG. 4, a cosine curve 402 represents a cosine of an angle between a free layer (e.g., free layer 156 (FIG. 1)) and a reference layer (e.g., the reference layer 152 (FIG. 1)) of the TMR element and an output curve 404 represents a normalized bridge output for the current-driven bridge 300. The output curve 404 does not match the cosine curve 402.

Figure 5:
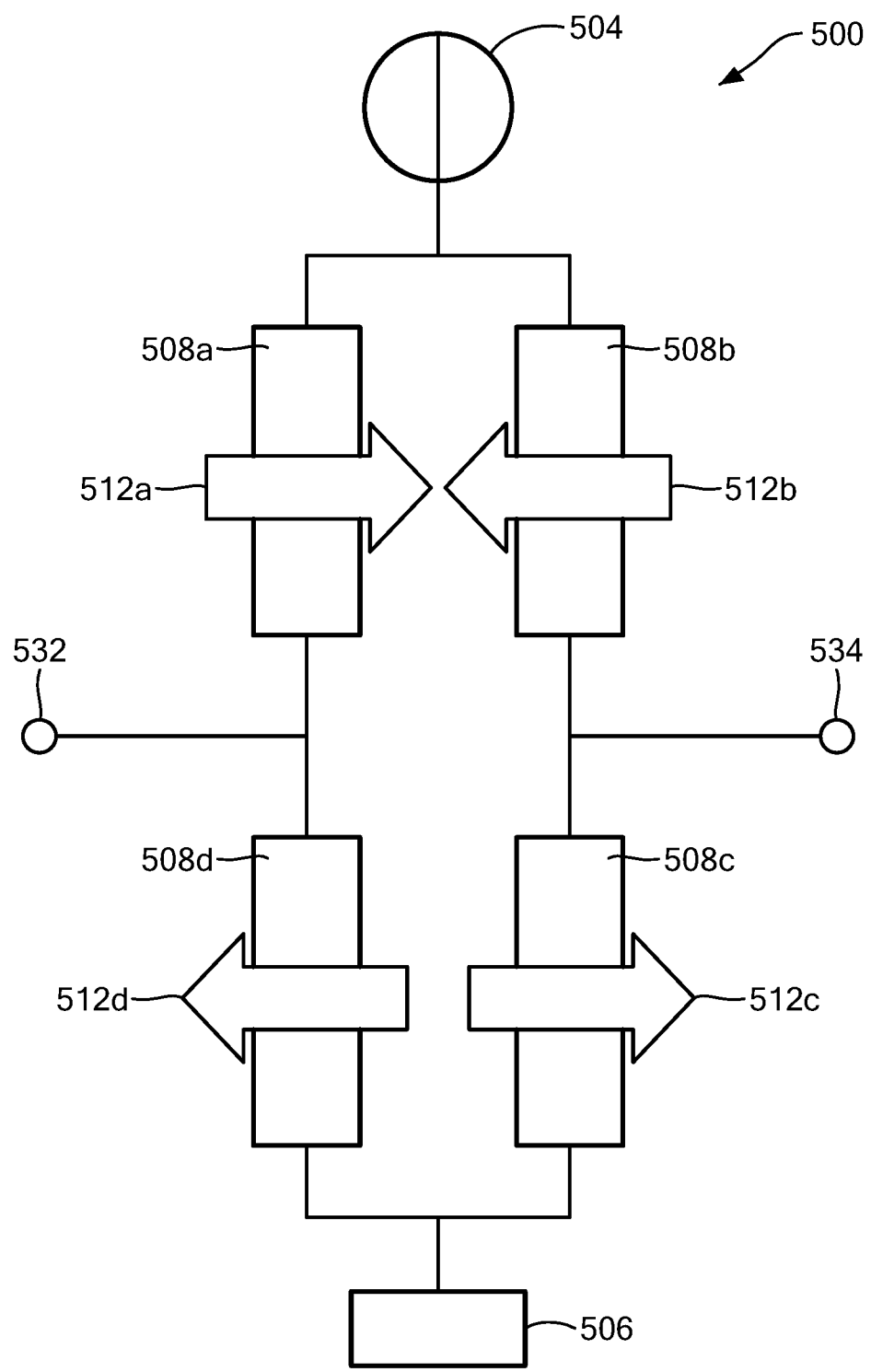
FIG. 5 is a circuit diagram of an example of a voltage-driven bridge having TMR elements.

Referring to FIG. 5, an example of a voltage-driven bridge with TMR elements is a volt-driven bridge 500. The volt-driven bridge 500 includes TMR elements (e.g., a TMR element 508a, a TMR element 508b, a TMR element 508c and a TMR element 508d).

Each TMR element has a reference direction. For example, the TMR element 508a has a reference direction 512a, the TMR element 508b has a reference direction 512b, the TMR element 508c has a reference direction 512c and the TMR element 508d has a reference direction 512d. The reference direction 512a is substantially in the same direction as the reference direction 512c but opposite (i.e. by 180°) from the reference direction 512b and the reference direction 512d.

The TMR element 508a and TMR element 308b are connected to a voltage source 504. In one example, the voltage source 504 supplies 1.0V. The TMR elements 512c and TMR element 512d are connected to ground 506.

The voltage-driven bridge 500 includes a node 532 between the TMR elements 508a, 508d and a node 534 between the TMR elements 508b, 508c. The output of the voltage-driven bridge 500 is the differential current across the nodes 532, 534.

Figure 6:
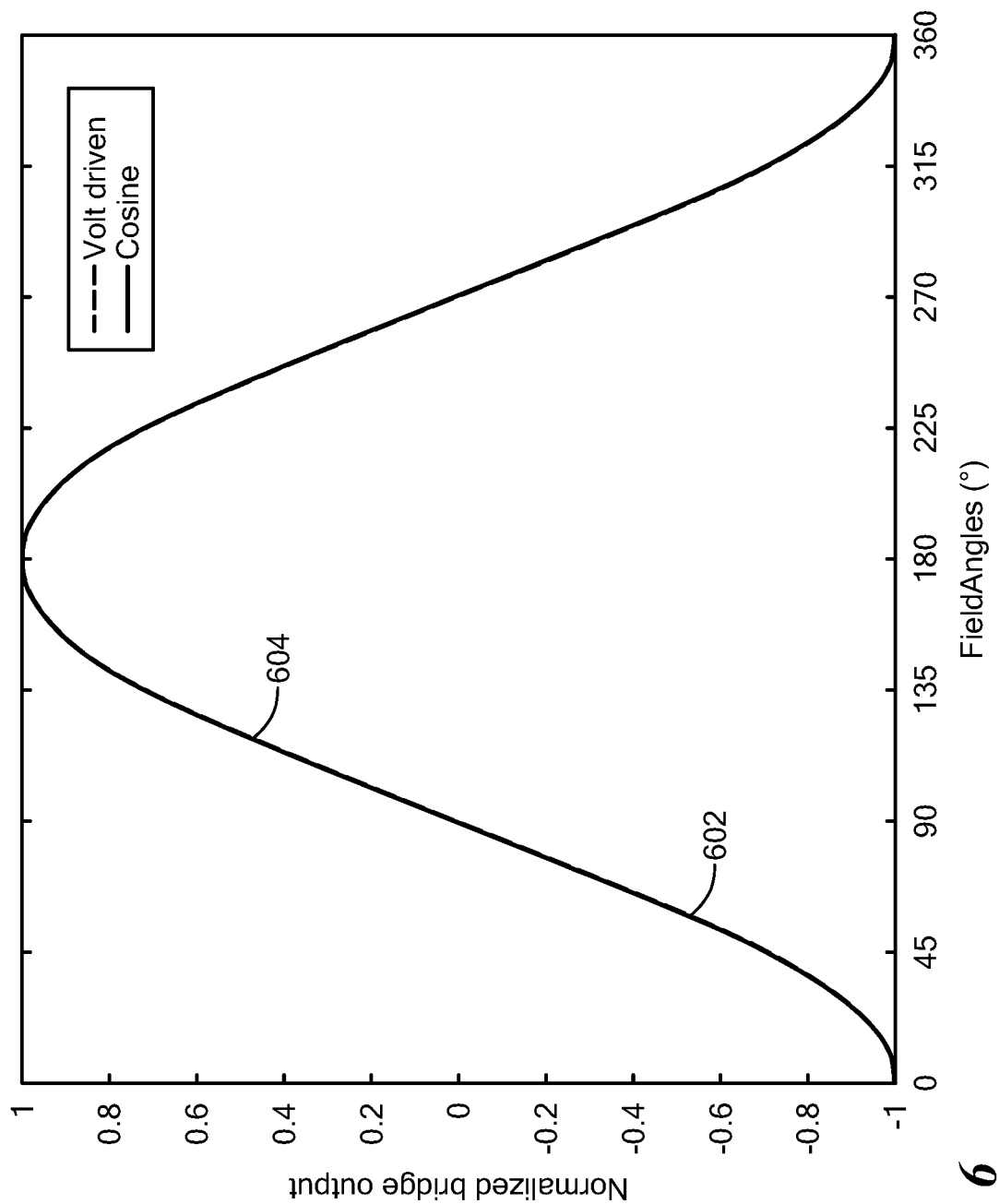
FIG. 6 is a graph of normalized bridge output versus field angles for the voltage-driven bridge of FIG. 5.

Referring to FIG. 6, a cosine curve 602 represents a cosine of an angle between a free layer (e.g., free layer 156 (FIG. 1)) and a reference layer (e.g., the reference layer 152 (FIG. 1)) of the TMR element and an output curve 604 represents a normalized bridge output for the voltage-driven bridge 500. Unlike the output curve 404 for the current-drive bridge 300, the output curve 604 for the voltage-driven bridge 500 is similar to the cosine curve 602.

As indicated in FIGS. 2A, 2B, 4 and 6, a voltage-driven bridge with TMR elements is more desirable than a current-driven bridge with TMR elements in reducing voltage non-linearity in a bridge.

Figure 7B:
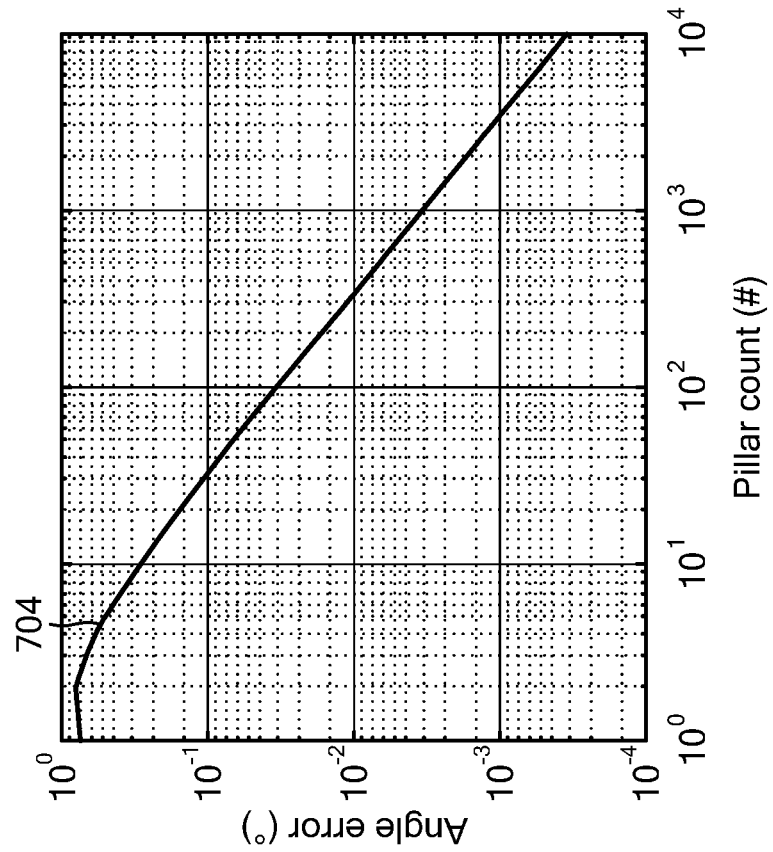
FIG. 7B is a graph of angle error versus pillar count for the voltage-driven bridge of FIG. 3.
Figure 7A:
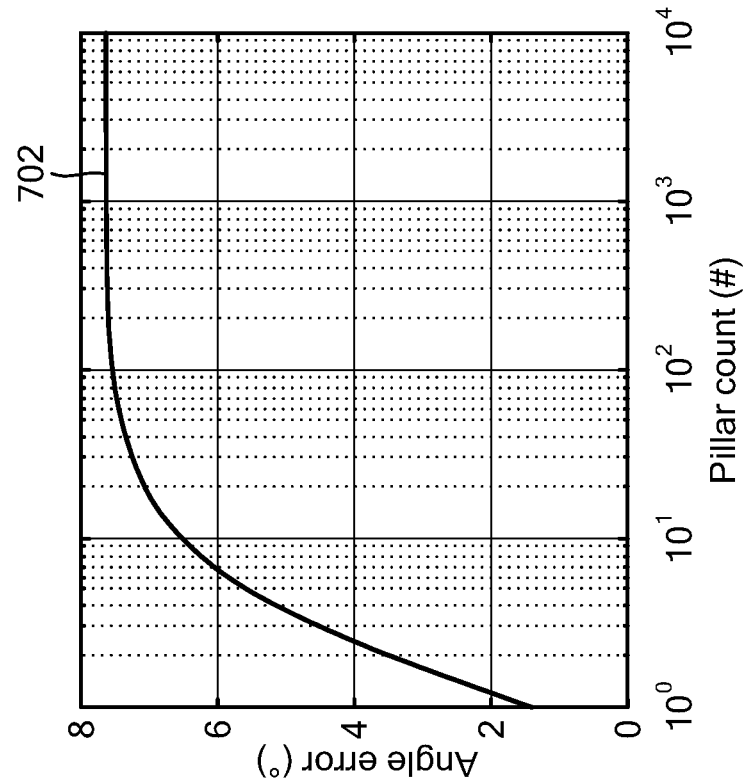
FIG. 7A is a graph of angle error versus pillar count for the current-driven bridge of FIG. 5.

Referring to FIGS. 7A and 7B, an error curve 702 represents angle error with respect to pillar count for a current-driven bridge and an error curve 704 represents angle error with respect to pillar count for a voltage-driven bridge. The curves 702, 704 indicate that increasing pillar count significantly reduces angle error in a voltage-driven bridge. For example, a pillar count of a 100 pillars can reduce the angle error to below 0.1°, a pillar count of more than a 1,000 pillars can reduce the angle error to below 0.01° and a pillar count of more than a 10,000 pillars can reduce the angle error to below 0.001° for an ideal TMR, i.e. of which free layer follows exactly the external field and the reference layer is completely insensitive to the external field. However increasing pillar count increases angle error in a current-driven bridge to a saturation point just under 8° but decreasing the pillar count improves the angle error in a current-driven bridge to about 2° or so for an ideal TMR.

Figure 8:
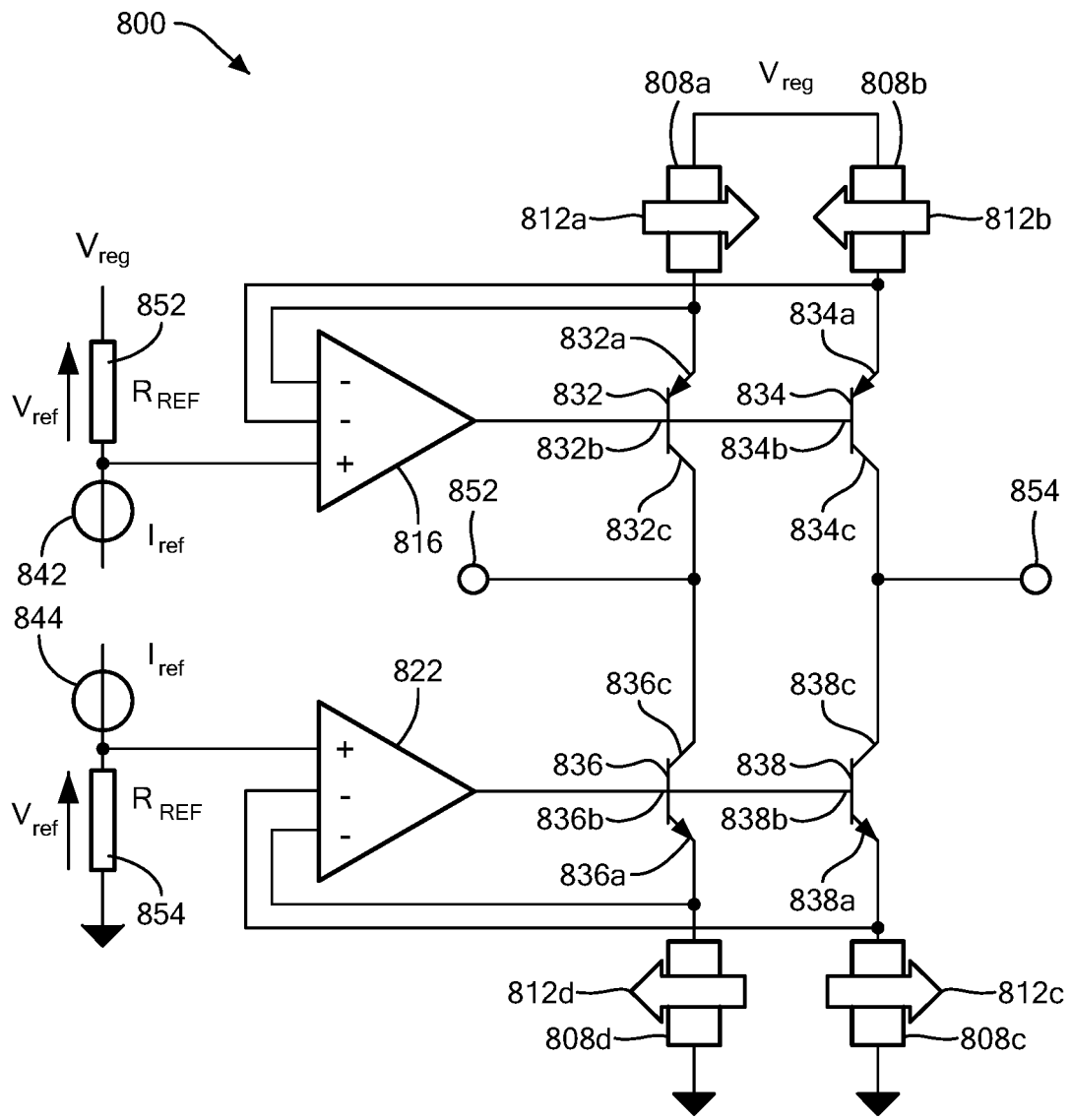
FIG. 8 is a circuit diagram of an example of a conductance bridge having TMR elements.

Referring to FIG. 8, a conductance bridge configuration 800 includes TMR elements (e.g., a TMR MR element 808a, a TMR element 808b, a TMR element 808c and a TMR element 808d). The conductance bridge configuration 800 also includes an amplifier 816, an amplifier 822, a transistor 832, a transistor 834, a transistor 836 and a transistor 838.

The TMR element 808a, 808b are connected to a voltage source $V_{reg}$ and the TMR elements 808c, 808d are connected to ground. A collector 832c of the transistor 832 is connected to a collector 836c of the transistor 836 and a collector 834c of the transistor 834 is connected to a collector 838c of the transistor 838.

Each TMR element 808a-808d has a reference direction. For example, the TMR element 808a has a reference direction 812a, the TMR element 808b has a reference direction 812b, the TMR element 808c has a reference direction 812c and the TMR element 808d has a reference direction 812d. The reference direction 812a is substantially in the same direction as reference direction 812c, but substantially in the opposite direction to reference directions 812b, 812d.

To hold constant the voltages across each TMR element 808a, 808b, 808c, 808d via a voltage feedback loop, the transistors 832, 834, 836, 838 may be used as a voltage follower. In one example, the transistors 832, 834 are PNP bipolar junction transistors and the transistors 836, 838 are NPN bipolar junction transistors. In another example, the transistors 832, 834 are p-type metal oxide semiconductor field-effect transistors and the transistors 836, 838 are n-type metal oxide semiconductor field-effect transistors. In other examples, the transistors 832, 834 are any combination of PNP bipolar junction transistors and p-type metal oxide semiconductor field-effect transistors and the transistors 836, 838 are any combination of NPN bipolar junction transistors and n-type metal oxide semiconductor field-effect transistors.

An output of the amplifier 816 is connected to a base 832b of the transistor 832 and is connected to a base 834b of the transistor 834. A first input of the amplifier 816 is connected to the TMR element 808a and is connected to an emitter 832a of the transistor 832. A second input of the amplifier 816 is connected to the TMR element 808b and is connected to an emitter 834a of the transistor 834. A third input of the amplifier 818 is connected to a current source 842 providing a current, $I_{ref}$ and connected to a resistor 852 having a resistance $R_{ref}$. The resistor 852 is connected to the voltage source $V_{reg}$.

In one example, the resistor 852 and the current source 842 provide a reference voltage, $V_{ref}$ to the amplifier 816. In one particular example, the reference voltage $V_{ref}$ provided by the current source 842 and the resistor 852 is adjustable based on variations of one or both of the TMR elements 808a, 808b. For example, the current source 842 and/or the resistor 852 may be adjusted over temperature to avoid clipping of the output signal post amplification.

An output of the amplifier 822 is connected to a base 836b of the transistor 836 and is connected to a base 838b of the transistor 838. A first input of the amplifier 822 is connected to the TMR element 808d and is connected to an emitter 836a of the transistor 836. A second input of the amplifier 828 is connected to the TMR element 808c and is connected to an emitter 838a of the transistor 838. A third input of the amplifier 838 is connected to a current source 844 providing a current, $I_{ref}$ and connected to a resistor 854 having a resistance $R_{ref}$. The resistor 854 is connected to ground.

In one example, the resistor 854 and the current source 844 provide a reference voltage, $V_{ref}$ to the amplifier 822. In one particular example, the reference voltage $V_{ref}$ provided by the current source 844 and the resistor 854 is adjustable based on variations of one or both of the TMR elements 808c, 808d. For example, the current source 842 and/or the resistor 852 may be adjusted over temperature to avoid clipping of the output signal post amplification.

The conductance bridge configuration 800 includes a node 852 between the transistors 832, 836 and a node 854 between the transistors 834, 838. The output of the conductance bridge configuration 800 is the differential current across the nodes 852, 854.

While FIG. 8 depicts two amplifiers 816, 822, two additional amplifiers may be added so that each amplifier is connected to a respective one TMR element and a respective one transistor.

Figure 9:
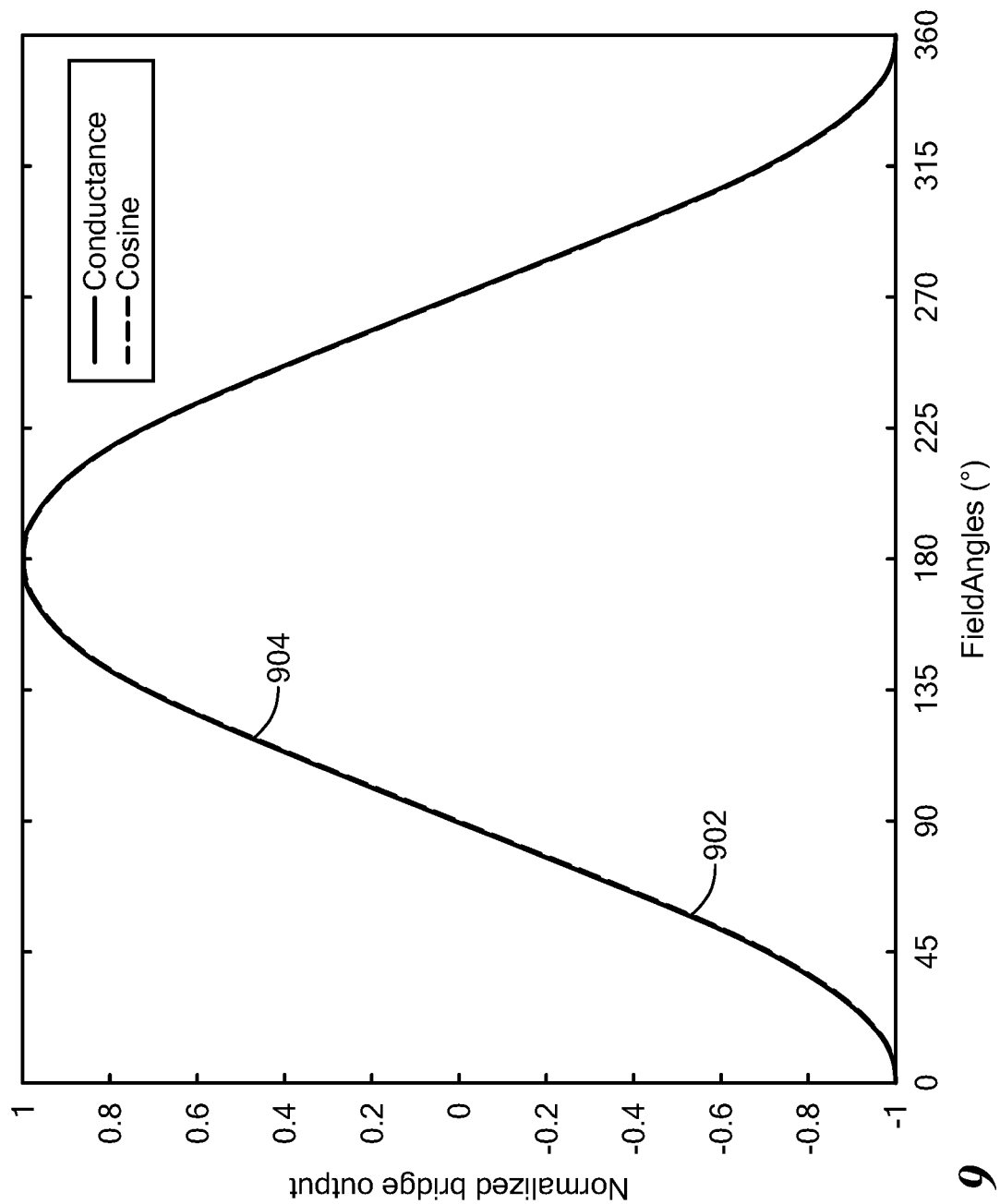
FIG. 9 is a graph of normalized bridge output versus field angles for the conductance bridge of FIG. 8.

Referring to FIG. 9, a cosine curve 902 represents a cosine of an angle between a free layer (e.g., free layer 156 (FIG. 1)) and a reference layer (e.g., the reference layer 152 (FIG. 1)) of the TMR element and an output curve 904 represents a normalized bridge output for the conductance bridge 800. The output curve 904 for the conductance bridge is similar to the cosine curve 902.

Figure 10:
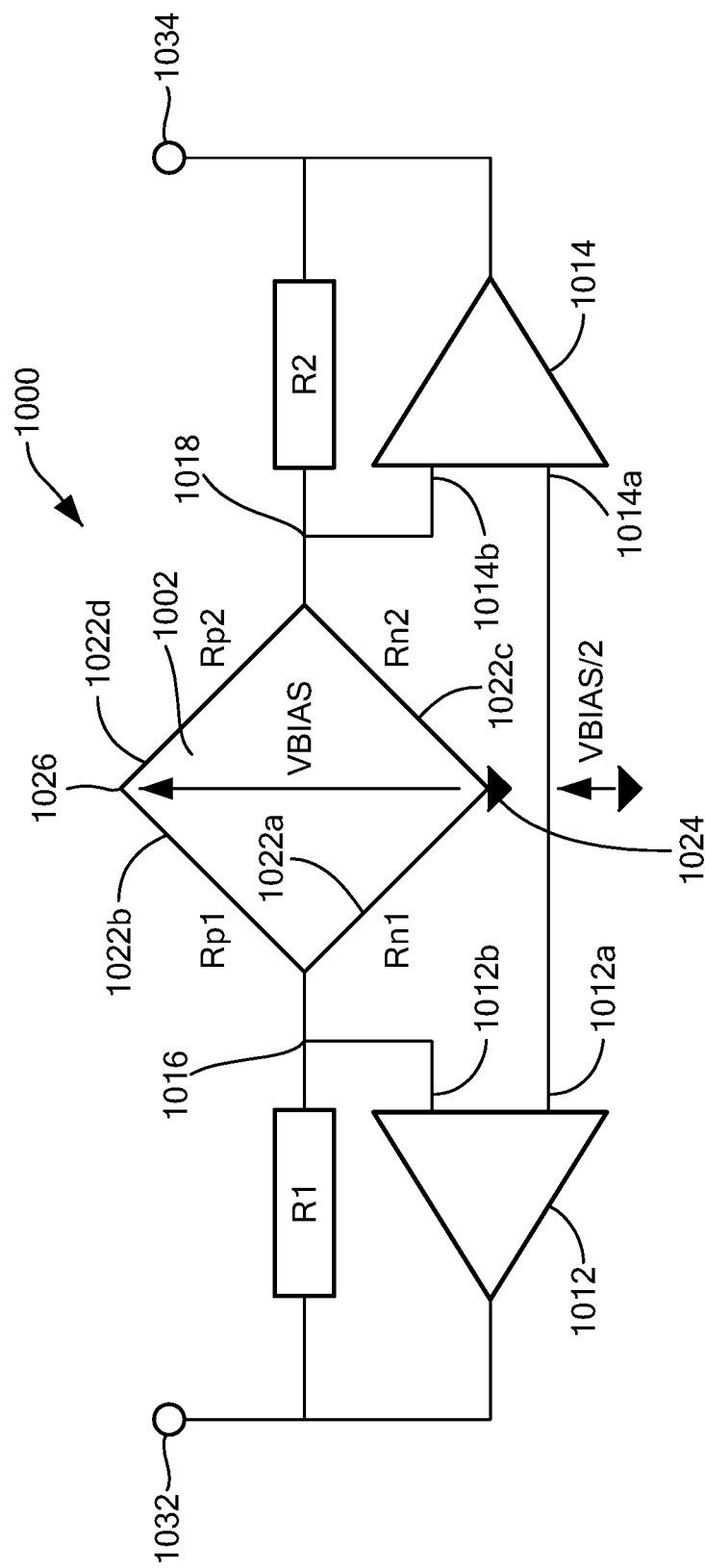
FIG. 10 is a circuit diagram of another example of a conductance bridge.

Referring to FIG. 10, another example of a conductance bridge configuration is a conductance bridge configuration 1000. The conductance bridge configuration 1000 includes an amplifier 1012, an amplifier 1014, a resistor, R1 and a resistor R2.

The conductance bridge 1000 also includes a bridge 1002 that includes a TMR element 1022a that has a resistance Rn1, a TMR element 1022b having a resistance Rp1, a TMR element 1022c having a resistance Rn2 and a TMR element 1022c having a resistance Rp2. The TMR element 1022a is connected to the TMR element 1022c at a node 1024 that is connected to ground and to the TMR element 1022b. The TMR element 1022d is connected to the TMR element 1022b at a node 1026 that is connected to $V_{BIAS}$ and to the TMR element 1022c. The bridge 1002 is biased with a constant voltage between the nodes 1024, 1026, which is a voltage $V_{BIAS}$.

An output of the amplifier 1012 is connected to the resistor R1 at a node 1032 and an output of amplifier 1014 is connected to the resistor R2 at a node 1034. A first input 1012a of the amplifier 1012 is connected to a first input 1014a of the amplifier 1014 and each input 1012a, 1014a receives a voltage $V_{BIAS}/2$.

A node 1016 is connected to a resistor R1, a second input 1012b of the amplifier 1012, the resistor Rp1 and the resistor Rn1. The current at the node 1016 is equal to:

$$V_{BIAS}/(2Rp1)-V_{BIAS}/(2Rn1).$$

A node 1018 is connected to a resistor R2, a second input 1014b of the amplifier 1014, the resistor Rp2 and the resistor Rn2. The current at the node 1018 is equal to:

$$V_{BIAS}/(2Rp2)-V_{BIAS}/(2Rn2).$$

A voltage at the node 1032 is a voltage V01. Assuming the current into the amplifier 1012 is negligible V01 is equal to:

$$[V_{BIAS}/(2Rp1)-V_{BIAS}/(2Rn1)]R1.$$

A voltage at the node 1034 is a voltage V02. Assuming the current into the amplifier 1014 is negligible V01 is equal to:

$$[V_{BIAS}/(2Rp2)-V_{BIAS}/(2Rn2)]R2.$$

If the output of the bridge configuration 1000 is VOUT and VOUT=V01−V02, then VOUT is equal to:

$$[V_{BIAS}/(2Rp1)-V_{BIAS}/(2Rn1)]R1-[V_{BIAS}/(2Rp2)-V_{BIAS}/(2Rn2)]R2.$$

In one example, $V_{BIAS}$ is adjusted with temperature such that variations caused by temperature to the TMR elements 1022a, 1022b, 1022c, 1022d are minimized with respect to VOUT.

Figure 11:
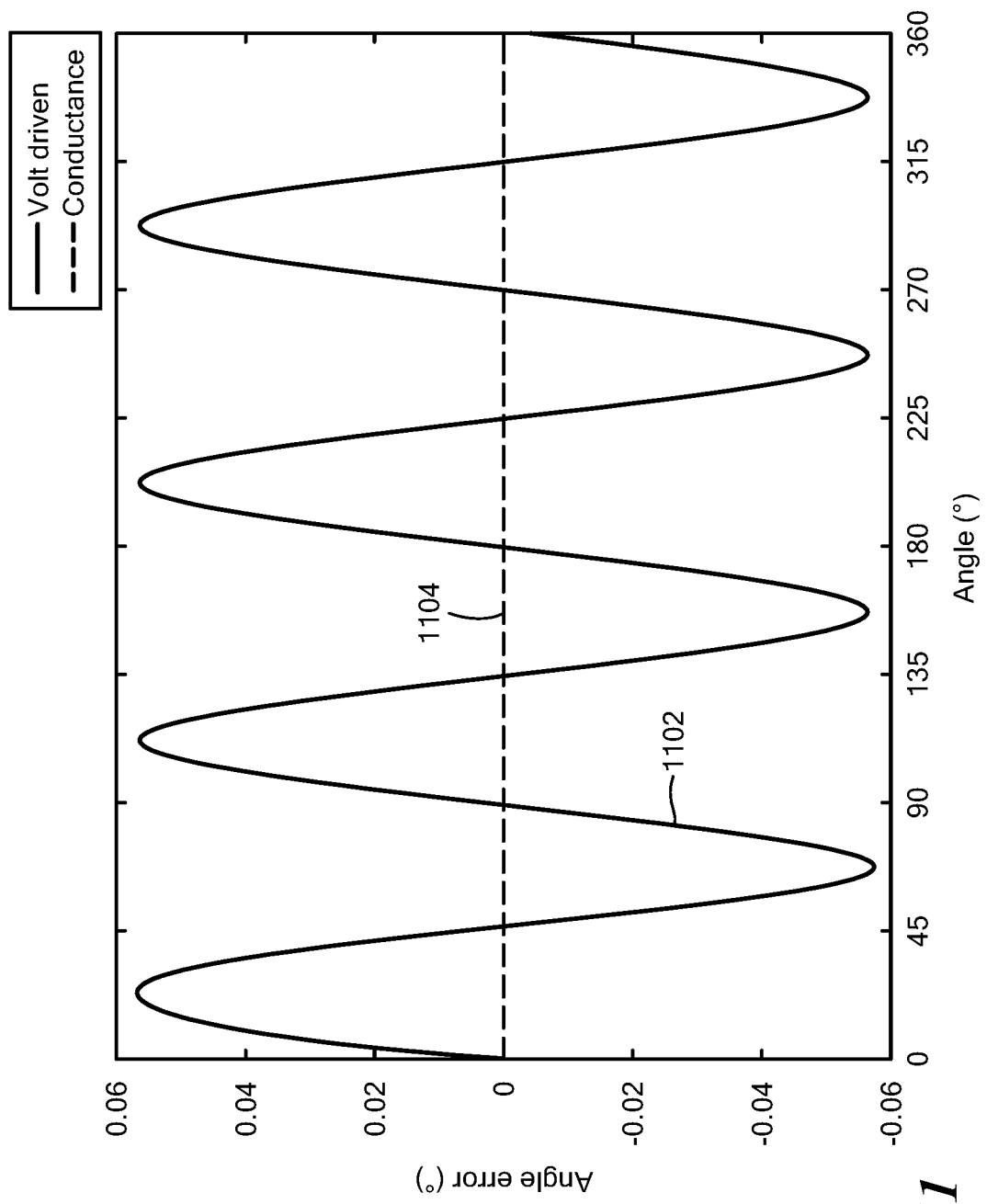
FIG. 11 is a graph of angle error versus angle for a voltage-driven bridge and a conductance bridge.

Referring to FIG. 11, an error curve 1102 for voltage-driven bridges using an ideal TMR indicates that the error is relatively small between 0.06° and −0.06° for all angles and an error curve 1104 for a conductance bridge using an ideal TMR has an error about 0.0°. FIG. 11 depicts error values for the voltage-driven bridge and for the conductance bridge where each TMR element has thirty pillars for each TMR element and the conductance bridge uses 0.5V per TMR element. In another example not shown in FIG. 11, a voltage-driven bridge having one pillar for each TMR element has an angle error between 0.5° and −0.5°.

Figure 12B:
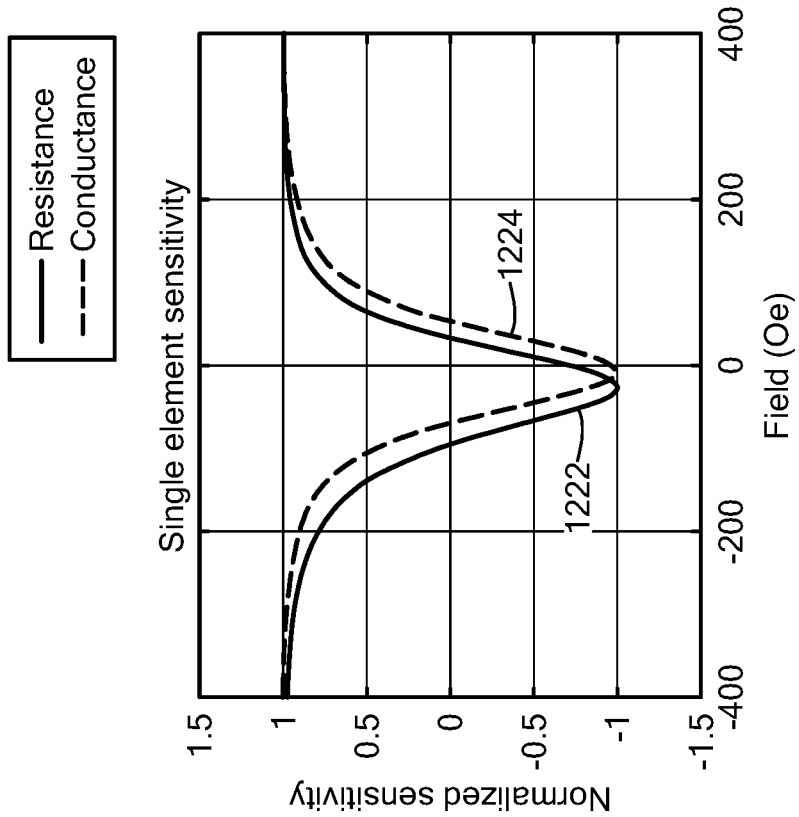
FIG. 12B is a graph of normalized sensitivity versus field for a single TMR element.
Figure 12A:
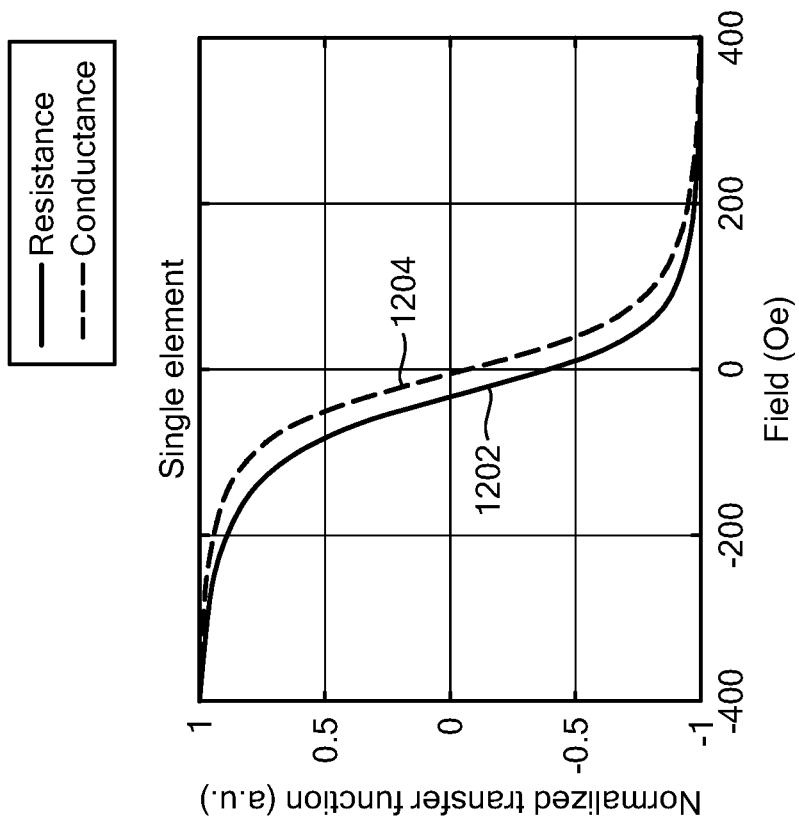
FIG. 12A is a graph of normalized transfer function versus field for a single TMR element.

Referring to FIGS. 12A and 12B, while the disclosure thus far indicates that conductance in a TMR element can be reduced to voltage linearity errors in an angle sensor, conductance in a TMR may be used to reduce voltage linearity errors in linear sensors. For example, a normalized resistance curve 1202 is different than a normalized conductance curve 1204. In particular, a resistance sensitivity curve 1222 is less symmetrical than a conductance sensitivity curve 1224 even for current or voltage driven bridges.

The processes and techniques described herein are not limited to the specific examples described herein.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A magnetic field sensor, comprising:
a plurality of tunneling magnetoresistance (TMR) elements comprising a first TMR element, a second TMR element, a third TMR element and a fourth TMR element arranged in a bridge, wherein a voltage across each TMR element is constant, wherein the first and second TMR elements are connected to a voltage source;
a plurality of transistors comprising a first transistor, a second transistor, a third transistor and a fourth transistor, wherein each transistor is connected to another transistor and to a corresponding one of the first TMR element, the second TMR element, the third TMR element or the fourth TMR element;
a first amplifier, wherein an output of the first amplifier is connected to a base of the first transistor and the output of the first amplifier is connected to a base of the second transistor, wherein a first input of the first amplifier is connected to the first TMR element and a second input of the first amplifier is connected to the second TMR element; and
a second amplifier, wherein an output of the second amplifier is connected to a base of a third transistor and the output of the second amplifier is connected to a base of a fourth transistor, wherein a first input of the second amplifier is connected to the third TMR element and the second input of the second amplifier is connected to the fourth TMR element.

2. The magnetic field sensor of claim 1, wherein the first and second transistors are each one of PNP BJT or a p-type metal oxide semiconductor field-effect transistor (MOSFET), and
the third and fourth transistors are each one of NPN BJT or a n-type MOSFET.

3. The magnetic field sensor of claim 1, further comprising a current source connected to a third input of the first amplifier.

4. The magnetic field sensor of claim 3, further comprising a resistor connected to the third input of the first amplifier.

5. The magnetic field sensor of claim 4, wherein the current source and the resistor provide a reference voltage.

6. The magnetic field sensor of claim 5, wherein the reference voltage is adjustable based on variations of one or more of the first to fourth TMR elements.

7. The magnetic field sensor of claim 1, further comprising a current source connected to a third input of the second amplifier.

8. The magnetic field sensor of claim 7, further comprising a resistor connected to the third input of the second amplifier.

9. The magnetic field sensor of claim 8, wherein the current source and the resistor provide a reference voltage.

10. The magnetic field sensor of claim 9, wherein the reference voltage is adjustable based on variations of one or more of the first to fourth TMR elements.

11. The magnetic field sensor of claim 1, wherein each TMR element has a pillar count of more than thirty pillars.

12. The magnetic field sensor of claim 1, wherein the bridge is a conductance bridge.

13. The magnetic field sensor of claim 1, wherein the bridge provides a bipolar current.

14. The magnetic field sensor of claim 1, wherein a reference direction of the first TMR element is opposite a reference direction of the second TMR element.

15. The magnetic field sensor of claim 14, wherein the reference direction of the first TMR element is opposite a reference direction of the fourth TMR element.

16. The magnetic field sensor of claim 15, wherein the reference direction of the first TMR element is equal to a reference direction of the third TMR element.

17. The magnetic field sensor of claim 1, wherein each TMR element comprises a free layer that changes with an applied field and a reference layer that is fixed.

18. The magnetic field sensor of claim 1, wherein the output of the first amplifier is connected to a base of the second transistor, wherein a second input of the first amplifier is connected to the second TMR element; and
   a second amplifier, wherein the output of the second amplifier is connected to a base of the fourth transistor, wherein a second input of the second amplifier is connected to the fourth TMR element.

19. The magnetic field sensor of claim 1, further comprising:
   a third amplifier, wherein an output of the third amplifier is connected to a base of the second transistor, wherein a first input of the third amplifier is connected to the second TMR element; and
   a fourth amplifier, wherein an output of the fourth amplifier is connected to a base of the fourth transistor, wherein a first input of the fourth amplifier is connected to the fourth TMR element.

20. A magnetic field sensor, comprising:
   a plurality of tunneling magnetoresistance (TMR) elements comprising a first TMR element, a second TMR element, a third TMR element and a fourth TMR element arranged in a bridge, wherein a voltage across each TMR element is constant, wherein the first and second TMR elements are connected to a constant voltage source, wherein the third and fourth TMR elements are connected to ground, wherein the first and third TMR elements are connected to a first bridge node and the second and third TMR elements are connected to a second bridge node;
   a first resistor connected to the first bridge node and a first output node;
   a second resistor connected to the second bridge node and a second output node;
   a first amplifier, wherein an output of the first amplifier is connected to the first output node and the first resistor, wherein a first input of the first amplifier is connected to the first bridge node and the first resistor; and
   a second amplifier, wherein an output of the second amplifier is connected to the second output node and the second resistor, wherein a first input of the second amplifier is connected to the second bridge node and the second resistor, wherein a second input of the second amplifier is connected to a second input of the first amplifier.

21. The magnetic field sensor of claim 20, wherein each TMR element has a pillar count of more than thirty pillars.

22. The magnetic field sensor of claim 20, wherein the bridge is a conductance bridge.

* * * * *

UNITED STATES PATENT AND TRADEMARK OFFICE
CERTIFICATE OF CORRECTION

PATENT NO. : 11,525,875 B2
APPLICATION NO. : 17/502391
DATED : December 13, 2022
INVENTOR(S) : Rémy Lassalle-Balier et al.

Page 1 of 2

It is certified that error appears in the above-identified patent and that said Letters Patent is hereby corrected as shown below:

In the Specification

Column 1, Line 45 delete "element can" and replace with --elements can--.

Column 1, Line 50 delete "field (e.g.," and replace with --fields (e.g.,--.

Column 3, Lines 61-62 delete "layers 152)." and replace with --layer 152).--.

Column 4, Line 31 delete "elements" and replace with --element--.

Column 4, Line 46 delete "volt-driven" and replace with --voltage-driven--.

Column 4, Line 47 delete "volt-driven" and replace with --voltage-driven--.

Column 4, Line 59 delete "308b" and replace with --508b--.

Column 4, Line 61 delete "elements" and replace with --element--.

Column 5, Line 6 delete "current-drive" and replace with --current-driven--.

Column 5, Line 22 delete "than a 10,000" and replace with --than 10,000--.

Column 5, Line 31 delete "TMR MR" and replace with --TMR--.

Column 5, Line 36 delete "element" and replace with --elements--.

Column 6, Line 5 delete "818" and replace with --816--.

Column 6, Line 22 delete "828" and replace with --822--.

Signed and Sealed this
Twelfth Day of December, 2023

Katherine Kelly Vidal
*Director of the United States Patent and Trademark Office*

Column 6, Line 24 delete "838" and replace with --822--.

Column 6, Line 60 delete "1022c having" and replace with --1022d having--.

Column 7, Line 21 delete "V01" and replace with --V02--.